United States Patent [19]

Takahashi et al.

[11] Patent Number: 5,041,729

[45] Date of Patent: Aug. 20, 1991

[54] RADIATION DETECTOR AND MANUFACTURING PROCESS THEREOF

[75] Inventors: Tetsuhiko Takahashi, Suginami; Minoru Yoshida, Nishitama; Hiroshi Takeuchi, Matsudo; Hideji Fujii, Nishitama; Haruo Itho, Hino; Toshikazu Shimada, Kokubunji; Kenji Maio, Suginami, all of Japan

[73] Assignee: Hitachi, Ltd., Tokyo, Japan

[21] Appl. No.: 261,420

[22] Filed: Oct. 24, 1988

[30] Foreign Application Priority Data

Oct. 28, 1987 [JP] Japan ................. 62-270200
Nov. 11, 1987 [JP] Japan ................. 62-283075
Dec. 28, 1987 [JP] Japan ................. 62-332333
Dec. 28, 1987 [JP] Japan ................. 62-332334

[51] Int. Cl.$^5$ .............................................. G01T 1/24
[52] U.S. Cl. ........................... 250/370.11; 250/370.09; 250/367
[58] Field of Search ............... 378/19; 250/370.11, 250/361, 363.01, 363.02, 363.08, 363.10, 370.09, 370.14, 366, 367, 368, 370.13

[56] References Cited

U.S. PATENT DOCUMENTS

| | | | |
|---|---|---|---|
| 3,936,645 | 2/1976 | Iversen | 250/367 |
| 4,547,670 | 10/1985 | Sugimoto et al. | 250/370.13 |
| 4,560,877 | 12/1985 | Hoffman | 250/370.11 |
| 4,563,584 | 1/1986 | Hoffman et al. | 250/370.11 |

*Primary Examiner*—Carolyn E. Fields
*Assistant Examiner*—David P. Porta
*Attorney, Agent, or Firm*—Antonelli, Terry, Stout & Kraus

[57] ABSTRACT

A radiation detector for use on X-ray CT scanner with a plurality of elements arrayed to form a detector block, which is structured that a plurality of thin-film photodiodes consisting of amorphous silicon each are formed on the back of a scintillator block having a width to cover the plurality of elements, a platelike supporting member provided with signal lines on the back is bonded to cover the photodiodes, the photodiodes and the signal lines are connected together through wire bonding, the scintillator block is divided into each element across separators on the supporting member.

12 Claims, 8 Drawing Sheets

RADIATION DETECTOR AND MANUFACTURING PROCESS THEREOF

BACKGROUND OF THE INVENTION

1. Field of Industrial Application

This invention relates to a radiation detector utilized for an X-ray CT scanner, and is particularly concerned with a radiation detector less in dispersion of detection sensitivity, high in detection sensitivity at high S/N ratio, easy for packaging, and a manufacturing process thereof.

2. Prior Art

A typical radiation detector for use on X-ray CT scanner includes that for which a scintillator and photodiode are combined.

Then, as mentioned in "OYO BUTURI", vol. 55 No. 8, 1986, published by Japan Society of Applied Physics, pp. 824 to 829, an application of an amorphous silicon photodiode is now being realized in then production of photodiodes.

The radiation detector for use on X-ray CT scanner wherefore an amorphous silicon photodiode is used in disclosed in Japanese Patent Laid-Open No. 151781/1987. In the example, an electrode from amorphous silicon photodiode is provided on a side end portion of a scintillator, and a substrate provided with a signal line beforehand is connected to the side end portion to wiring.

SUMMARY OF THE INVENTION

In the aforementioned prior art nothing has been taken into consideration for packaging a multiplicity of elements with precision and efficiently, and thus adjacent elements are disclosed from each other every so often. As a result, in case the detector is used on CT scanner, a quality of CT picture deteriorates. inevitably, an artifact is produced and so forth.

As for structure wherein elements can be arrayed accurately particulars are given in application for U.S. patent Ser. No. 07/239,387 titled "Multi-Element Type Radiation Detector", filed Sept. 1, 1988 now U.S. Pat. No. 4,982,095, which was filed by some of the inventors and assigned to the same assignee.

However, a structure and manufacturing process of the multi-element type radiation detector ready for wiring from a multiplicity of detector elements and using a high reliability amorphous silicon are not disclosed therein.

One of the objects of the invention is to provide a radiation detector block for use on an X-ray CT scanner which is ready for wiring and high in reliability.

Another object of the invention is to provide a radiation detector block for use on X-ray CT scanner working at a high S/N ratio.

An even further object of the invention is to provide a radiation detector block for use on an X-ray CT scanner, lightweight and solid in structure, and free from noise arising due to vibrations at the time of high-speed rotation of a detector block.

The invention is characterized by a construction wherein a plurality of thin photodiodes each consisting of an amorphous silicon are formed on the back of scintillator block having a width sufficient to form a plurality of detector elements, a platelike supporting member with a signal like provided on the back thereof is bonded to cover each of the photodiodes and the photodiodes and a signal line on the supporting member are connected through a wire bonding, and the scintillator block is divided into each detector element across a separator on the supporting member. In such construction, since each divided scintillator has the back fixed firmly on the supporting member, a high positional precision and reliability are ensured, and each signal line can be arranged easily and at high reliability through the wire bonding.

Another feature of the invention will be made apparent according to a concrete description of the embodiment.

DETAILED DESCRIPTION OF PREFERRED EMBODIMENT

Figure 1A:
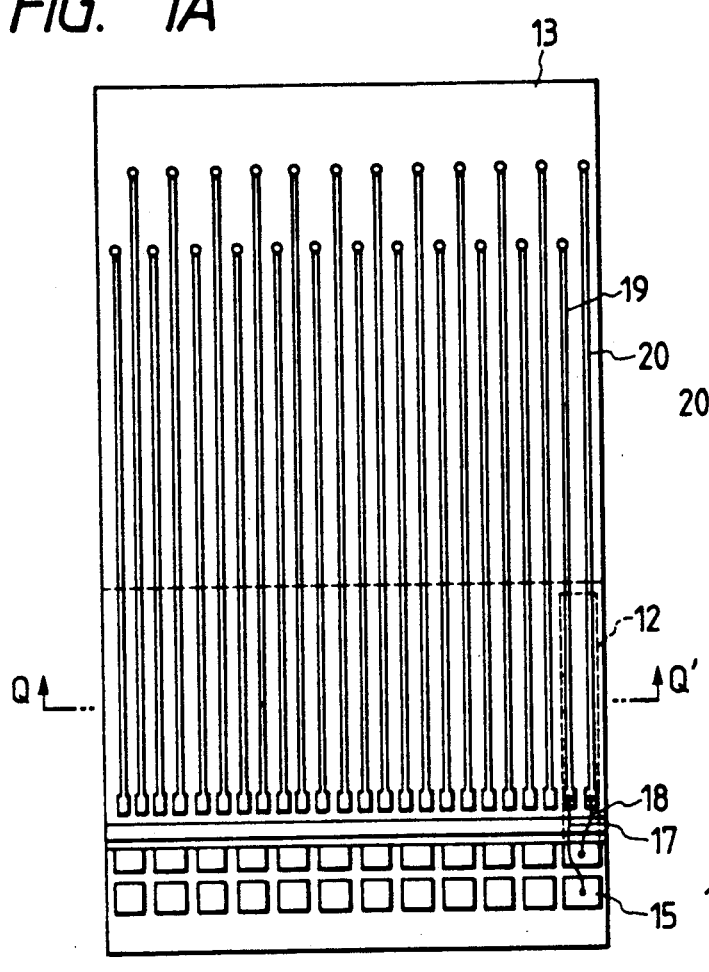
FIG. 1 A, B, C and FIG. 3 A, B, C are plan views and side views representing a state halfway of a manufacturing process of one embodiment of the invention.
Figure 1B:
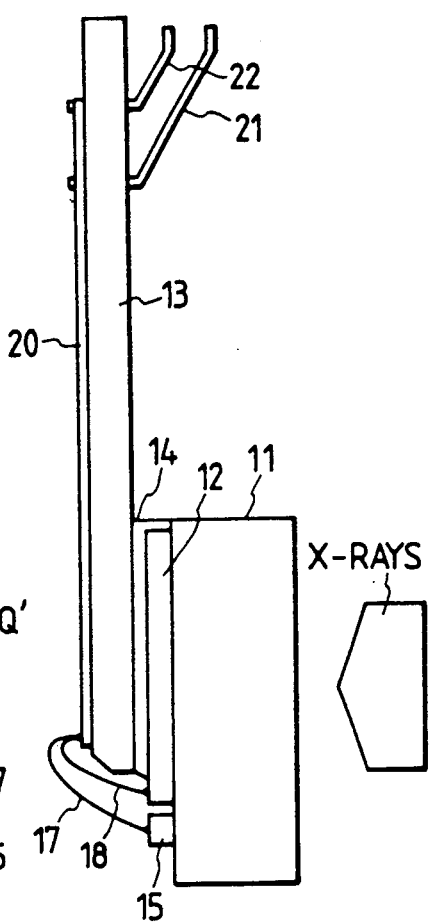
Figure 1C:
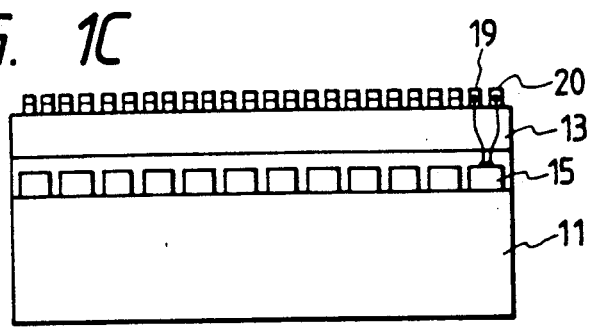

The invention will now be described with reference to FIG. 1 representing one embodiment thereof.

In the embodiment, X-ray detector elements are arrayed in 12 pieces to form a detector block, and a plurality of detector blocks are arrayed circularly to form a detector array for an X-ray CT scanner. FIG. 1 shows a stage halfway in a manufacturing process of the detector block. FIG. 1 A shows a back of the block, and FIGS. 1 B and 1 C show, respectively a side thereof.

A scintillator 11 is made of ceramic with $Gd_2O_2S$: Pr, Ce, F as components, and its dimensions are, for example, 20 to 30 mm longitudinally, 15 to 25 mm in the direction of channel and 1 to 3 mm in thickness. Pin-structured photodiodes 12 each consisting of an amorphous silicon layer 16 to 26 mm long and 1 to 2 mm wide are arranged in 12 pieces provided on the back of the scintillator. FIG. 1 A indicates only that portion of of a photodiode position on the end representatively by a broken line.

Figure 2:
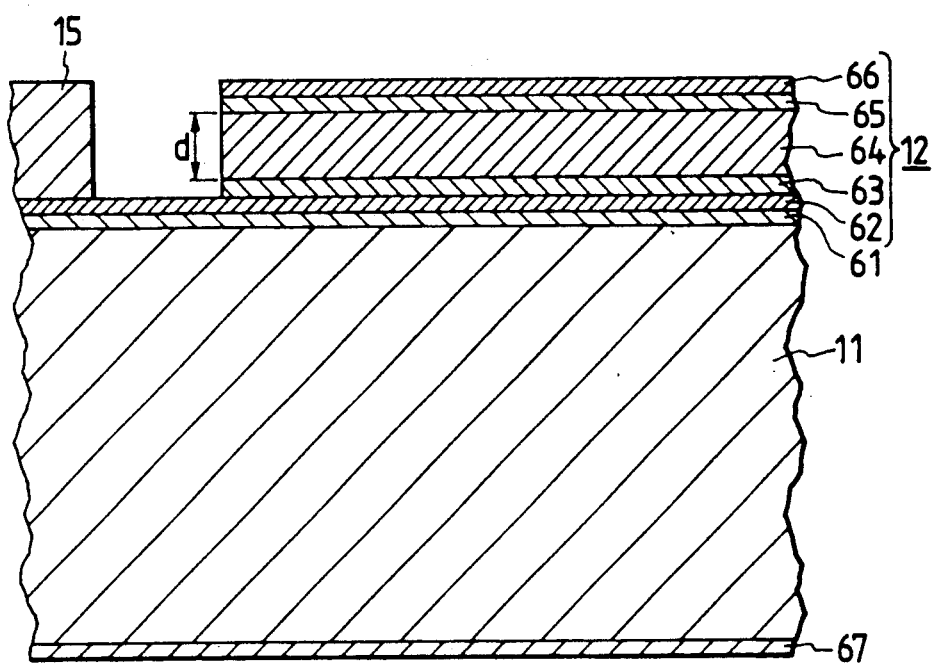
FIG. 2 is a sectional view showing one part of the embodiment.

FIG. 2 is a sectional view showing a detail of a scintillator 11, the photodiode 12 and a bonding pad 15. An Al light reflection layer 67 is provided on a front (X-ray incident plane) of the scintillator 11, and an $SiO_2$ protection layer 61 is provided on the back thereof. A transparent electrode 62 of indium tin oxide (ITO) is provided on the protection layer 61. The bonding pad 15 is provided on the ITO 62 at an end position of each element domain obtained through dividing the back of the scintillator into said 12 pieces. Then, a p-type amorphous silicon layer 63, an i-type amorphous silicon layer 64, an n-type amorphous silicon layer 65 and an upper electrode layer 66 are provided successfully on the ITO 62 at the remaining portion of each domain, thus forming the pin photodiode 12.

With reference again to FIG. 1, a supporting member 13 is bonded on the photodiode by an insulating adhesive 14. The supporting member 13 is bonded to cover all the 12 photodiodes. an end portion of each photodiode is left exposed for wiring. The supporting member 13 is formed of a ceramic insulator or glass epoxy, and signal lines 19, 20 for each element are formed on its back through a printed circuit. Further, each signal line is connected to pins 21, 22 for external connection. The bonding pad 15 of each photodiode 12 and one end of the signal line 19 are connected through wire bonding. An exposed portion of the upper electrode 66 of a photodiode 12 and one end of the signal line 20 are connected likewise through wire bonding. Conductors 17 and 18 used therefor are gold or aluminum wires. Then, the conductors 17 and 18 are indicated for one element only so as to avoid a visual confusion in FIG. 1.

Figure 3A:
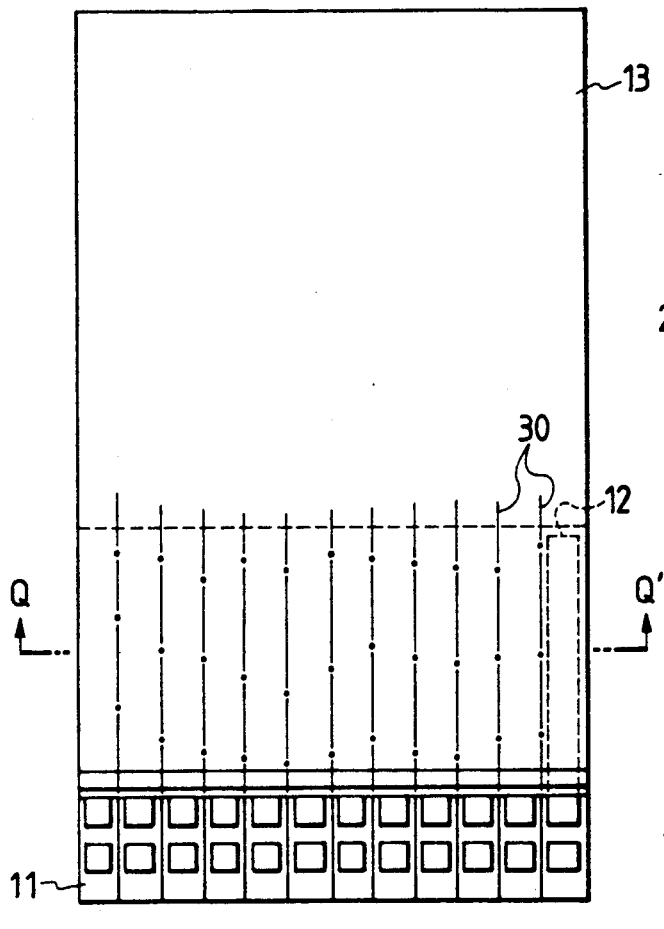
Figure 3B:
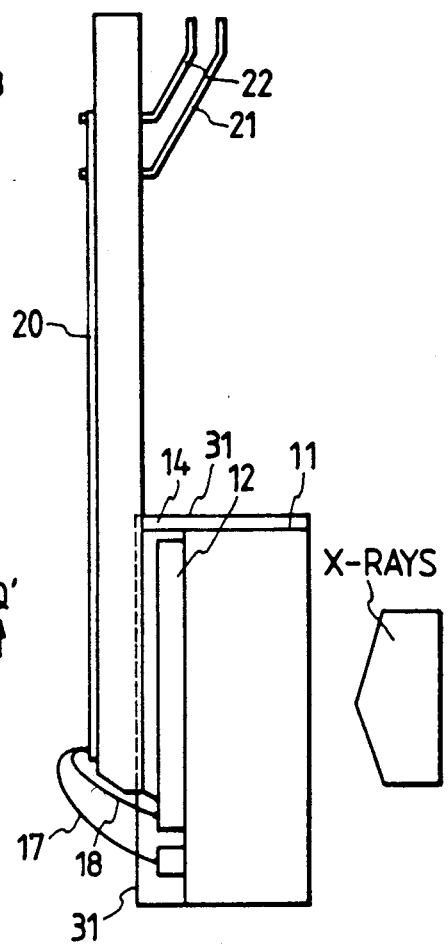
Figure 3C:
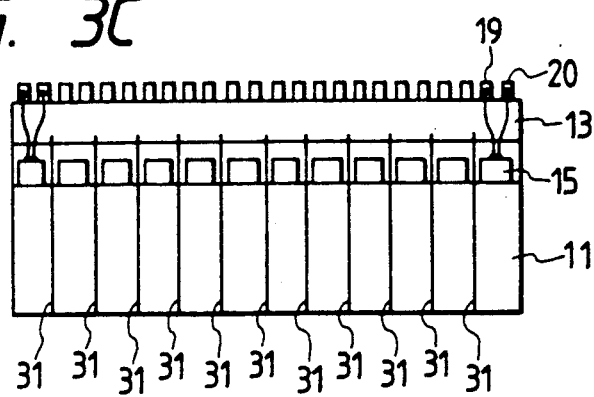

Next, the wire bonding part is protected, as occasion demands, by insulating resin or the like, and then the scintillator is cut at a position 30 indicated by one-dot chain like in FIG. 3 A, or along the line to divide each element domain. For cutting, the scintillator 11 is grooved from an X-ray incident plane side by means of a diamond. The groove can be adjusted to be 100 to 200 μ in width.

Figure 4:
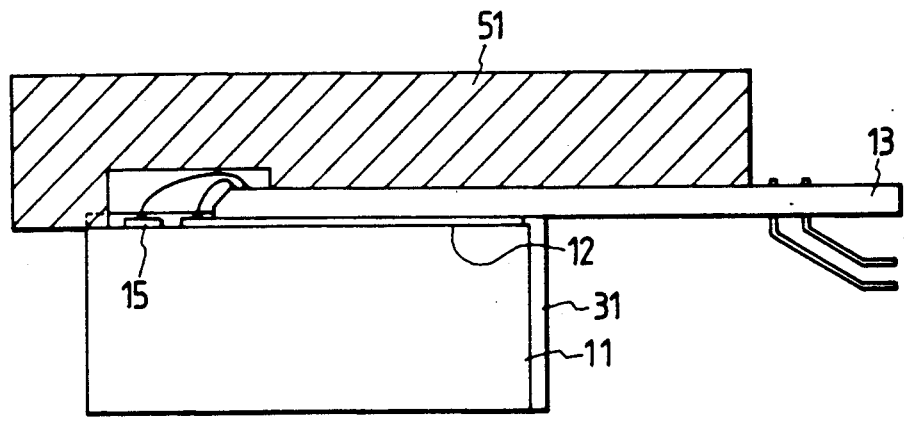
FIG. 4 is a side view showing a state wherein the embodiment is completed.

As described above, since the scintillator block 11 has already been bonded solidly to the supporting member 13, each scintillator element will not separate into pieces even from cutting the scintillator 11 thoroughly in the process, and a positional precision of the element array may be ensured accordingly. It is preferable that the groove be deep to reach at least the surface of the supporting member 13. Next, as shown in FIG. 3 B and FIG. 3 C, a separator 31 is inserted in the groove. The separator 31 is that for which aluminum is vaporized on the surface of a molybdenum plate having a thickness of 50 to 150 μm and is functional as separating light between scintillators of each channel and a scattered radiation, and reflecting the scintillation light to enhance sensitivity. Further, as shown in FIG. 4, a second supporting member 51 in which a wire bonding position is hollowed out is fixed on a back of the supporting member 13 and one end of the scintillator 11 with an adhesive. The supporting member 13 described hereinabove cannot be thickened excessively as wire bonding is performed on its end position. Accordingly, there may be a case where strength is not fully ensured only by the supporting member 13. A satisfactory strength may therefore be obtained by additionally bonding a supporting member 51 thereon. Then, the bonding pad 15 thickened enough may facilitate wire bonding work. Consequently, the bonding pad 15 is obtainable otherwise through building up a conductor by a thick-film printing on a metallic layer formed by a thin-film process. Further, if the bonding pad 15 thickened sufficiently so as not to be cut when cutting the scintillator 11, then it can be used as a ground electrode common to the 12-channel detector elements.

Thus, the detector block consisting of 12 elements which is bonded to the supporting member 13, has a signal line connected thereto and further the other supporting member 51 bonded thereto is lightweight and solid, and hence is suitable for constructing a detector array for use on CT scanner.

Figure 5:
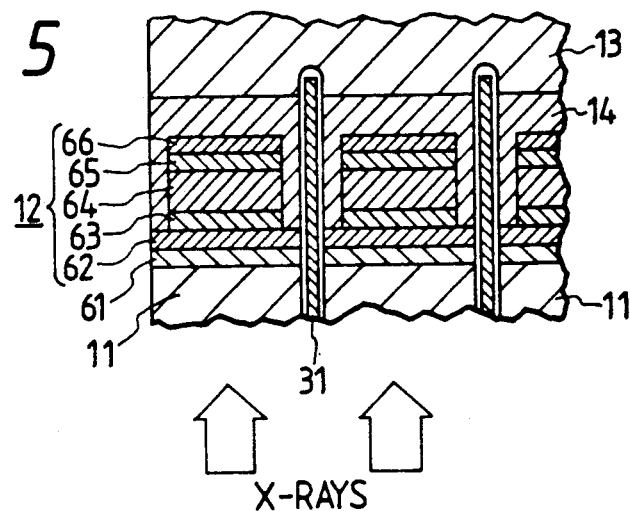
FIG. 5, FIG. 6 and FIG. 7 are sectional views representing an example of detailed sectional form of the embodiment, each.
Figure 6:
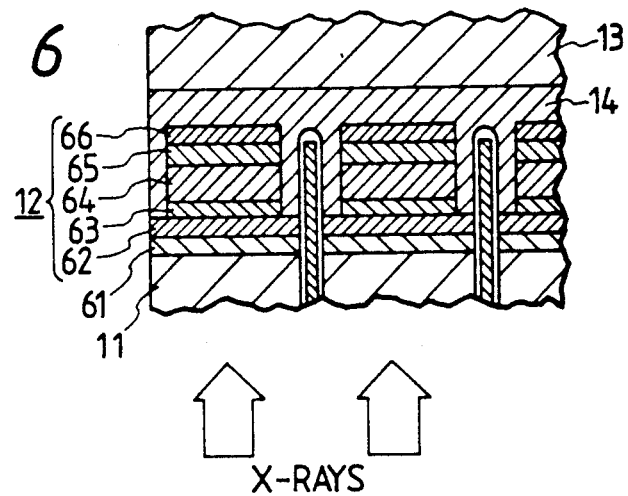
Figure 7:
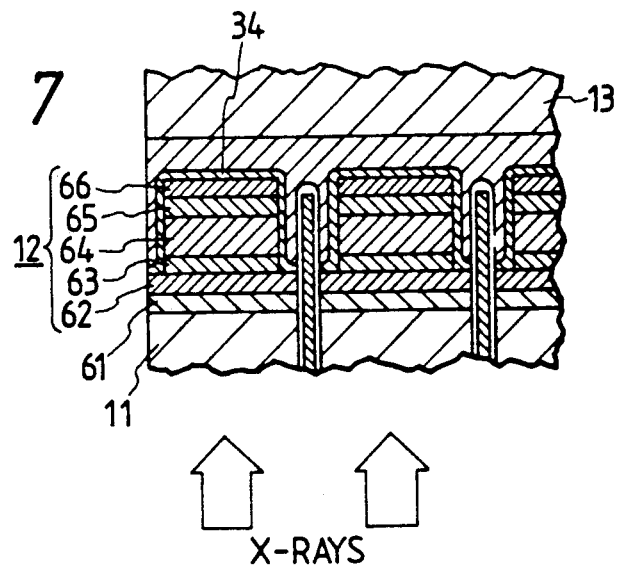

Next, a shape of the photodiode of the aforementioned detector will be described in detail. FIG. 5 is an enlarged sectional view of the photodiode taken on line Q—Q' of FIG. 3 A. Like reference characters represent like parts of FIG. 2. The amorphous silicon layers 63, 64, 65 and the upper electrode 66 which form the photodiode are formed at positions away from the groove for separating the channels, and these portions will be covered by the adhesive layer 14. Thus, the adhesive layer 14 functions as a protection layer, and prevents the adjacent photodiodes from short-circuiting electrically each other through the separator 31. The each groove reaches the supporting member 13, as shown in FIG. 5, and it is preferable that a tip of the separator 31 reach the supporting member 13 for prevention of a crosstalk between the channels. However, if a material opaque to the scintillation light is used for the adhesive 14, then the situation that the tip of groove or separator 31 has reached the adhesive layer 14 as shown in FIG. 6 leaves nothing to be desired. Further, as shown in FIG. 7, if the surface of the photodiode 12 that the adhesive covers at least is coated with an insulation protection layer 34 such as polyimide isoindoloquinazolinedione, $SiO_2$ or the like, the adhesive 14 must not necessarily be an insulating material.

Figure 8:
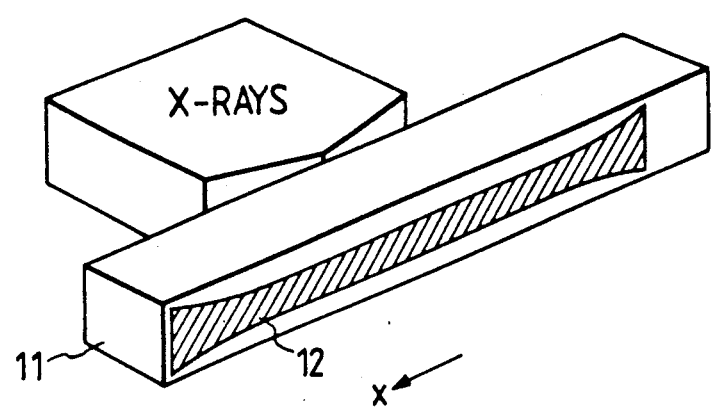
FIG. 8 and FIG. 10 are a perspective view and a plan view respectively, showing an example of a form of photodiode of the embodiment.
Figure 9A:
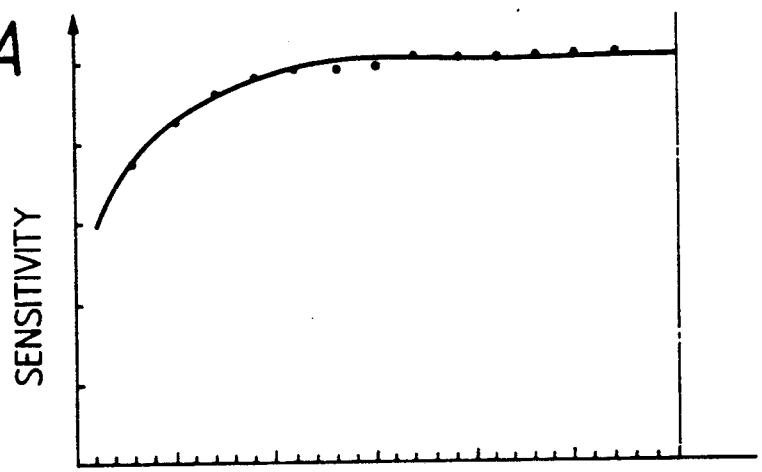
FIG. 9 A and B are characteristic drawings showing a sensitivity distribution of the embodiment, each.
Figure 9B:
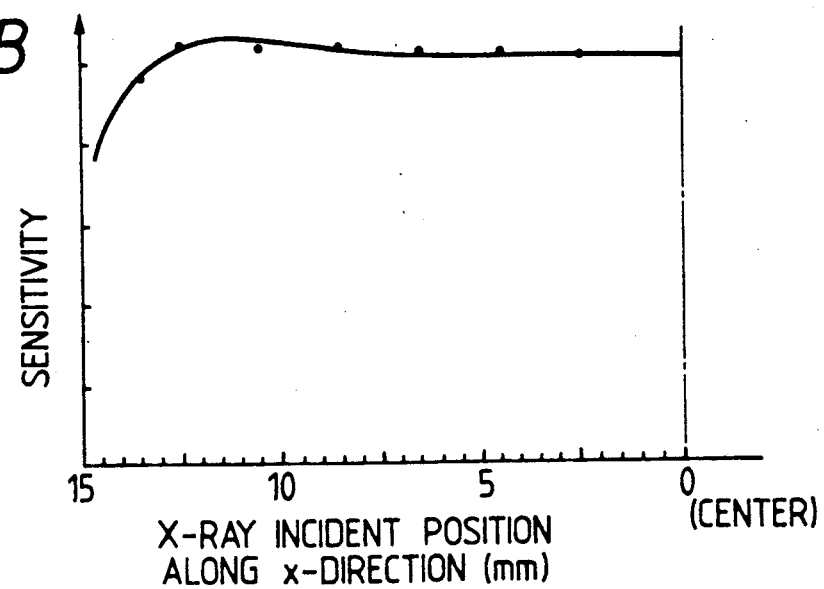

FIG. 8 shows the most desirable form of the photodiode 12. It is preferable that the photodiode 12 has a shape a little wider in width, as illustrated, when it approaches the opposite ends. FIG. 9 A shows a distribution of X-ray detection sensitivity in the longitudinal direction (X direction of FIG. 8) when the photodiode is formed into a rectangle uniform in width, and FIG. 9 B shows a similar sensitivity distribution in the shape of FIG. 8. A light transmission efficiency to the photodiode varies between end position and center according to a dispersion of the light in the scintillator. Accordingly, X-ray detection sensitivity at the end portion deteriorates, as shown in FIG. 9 A, from forming the photodiode into a rectangle uniform in width. Then, in the shape of FIG. 8, a deterioration of the detection sensitivity at the end portion is reduced, and the sensitivity distribution in the direction X, or in the direction of thickness of a fan beam of X-ray CT scanner becomes close uniformly as shown in FIG. 9 B. The uniform sensitivity distribution is available to reducing a generation of artifact characteristic at the time of centriciput image pickup.

Figure 10:
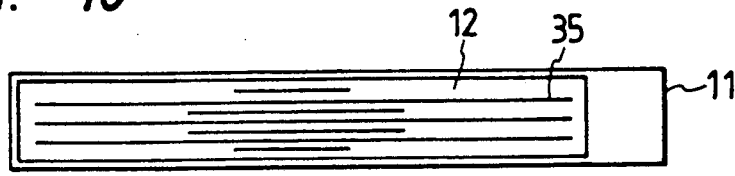

FIG. 10 represents another example wherein the sensitivity distribution in the direction X is idealized best. The photodiode 12 is formed into a rectangle uniform in width, however, the rectangular photodiode is grooved 35 through laser patterning, and the photodiode is removed partially, thereby adjusting the sensitivity. Here, a beam width of the laser patterning will be kept at, for example, 100 to 500 μm, which must be small as compared with an expansion of the luminescence flux in the scintillator. Then, the groove 35 is made rough in pitch near the end portion but fine at the center, thereby keeping the sensitivity uniform as a whole. The pattern for removal in the embodiment may be a form such as dot or the like otherwise.

Described next is a thickness of the photodiode for detectors, and particularly a thickness of the i-type amorphous silicon layer.

In the pin-type photodiode used for the above-described embodiment, the thickness of a depletion layer is almost equal to a thickness d of the i-type layer (with reference numeral 64 in FIG. 2). Further, the thickness d relates to a value of the light detection current of a detector and an S/N ratio of the detection signal. First, a noise voltage $V_N$ of the detection signal is expressed generally by the following equation:

$$V_N^2 = V_X^2 + V_D^2 \qquad (1)$$

where $V_X$ denotes an X-ray quantum noise voltage, and $V_D$ denotes a detector noise voltage.

Accordingly, with a detection signal voltage as $V_S$, the following equation is obtained:

$$(S/N)^2 = V_S^2/V_N^2 = V_S^2/(V_X^2 + V_D^2) \qquad (2)$$

Figure 11:
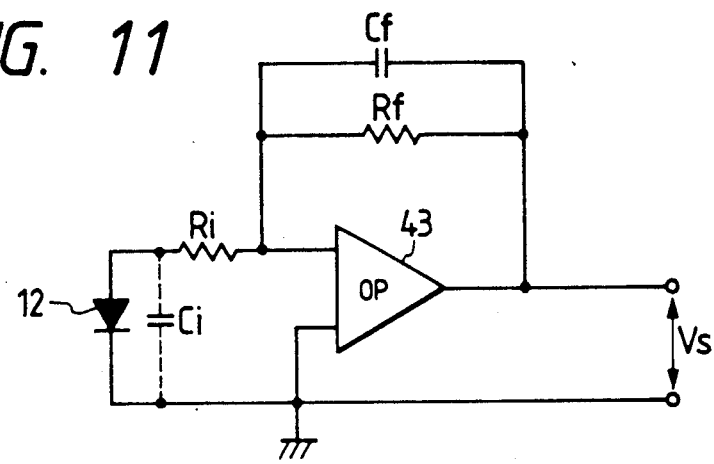
FIG. 11 is a circuit diagram showing an electrical connection of the embodiment.

In the detector for use on X-ray CT scanner of the invention, an output of each photodiode is connected to a detection circuit including an operational amplifier 43 shown in FIG. 11, and the detection signal voltage $V_S$ is obtained. Then, in FIG. 11, $R_i$ denotes an input resistance, $R_f$ denotes a feedback resistance, $C_f$ denotes a feedback capacitance, and $C_i$ denotes an input capacitance caused by a capacitance C of the photodiode 12. The detection signal voltage $V_S$ is expressed by the following equation:

$$V_S = i_S R_S = eXpq(d)R_f \qquad (3)$$

where $i_s$ denotes a signal current, X denotes an X-ray absorptiveity (X—photon number/elements·sec.) of the detector scintillator, p denotes a conversion quantum efficiency of a phosphor from X-ray photon into visible photon, and q(d) denotes a photoelectric conversion quantum efficiency dependent on a depletion layer thickness of the amorphous silicon photodiode 12.

That is, $V_S$ represents a function of the depletion layer thickness, or the i-layer thickness d, and the i-layer thickness d is normally set so as to maximize $V_S$. With a green light selected as typical of a scintillator-emitted light wave length, and an area of the photodiode kept constant at 25 mm$^2$, a result given in FIG. 12 was obtained from measuring $V_S$ to the green light by changing the i-layer thickness d variously. From FIG. 12, it is understood that the detection signal voltage $V_S$ will be maximized at d being about 0.5 μm.

On the other hand, the noise voltage $V_N$ will be taken up as follows:

First, the X-ray quantum noise voltage $V_X$ is expressed by the following equation:

$$V_X = V_S \sqrt{X \cdot t} \qquad (3)$$

where t denotes an X-ray irradiation time.

Then, in a diagnostic X-ray CT scanner, an X-ray 120 K volt in X-ray tube voltage is irradiated at 1 mR for 1 ms per, for example, profile data. When transmitted through the human abdomen, the X-ray attenuates to about 1/1,000. Consequently, with an X-ray-absorptivity of the scintillator at 0.9 and an X-ray incident area of the scintillator at 20 mm$^2$, the number of X-rays $X_t$ absorbed by the detector is:

$$X_t = 1 \ (mR) \times 20 \ (mm^2) \times 6.67 \times \qquad (5)$$
$$10^{11}(X - photon/mR \cdot mm^2) \times 10^{-3} \times 0.9 = 1.2 \times$$
$$10^4(X - photon/elements)$$

Accordingly, from Eqs. (3) to (5), $(S/N)_X$ due to an X-ray quantum noise may be such as expressed by the following equation:

$$(S/N)_X = \sqrt{X \cdot t} = 110 \qquad (6)$$

Next the detector noise voltage $V_D$ will be taken up for examination. The noise to be considered in a detection system of FIG. 11 includes a current noise and a voltage noise. However, in the case of amorphous silicon diode, a resistance of the material itself is high, and a leak current is minimized at, for example, 10 to 20 pA, therefore the current noise may be neglected.

Figure 13:
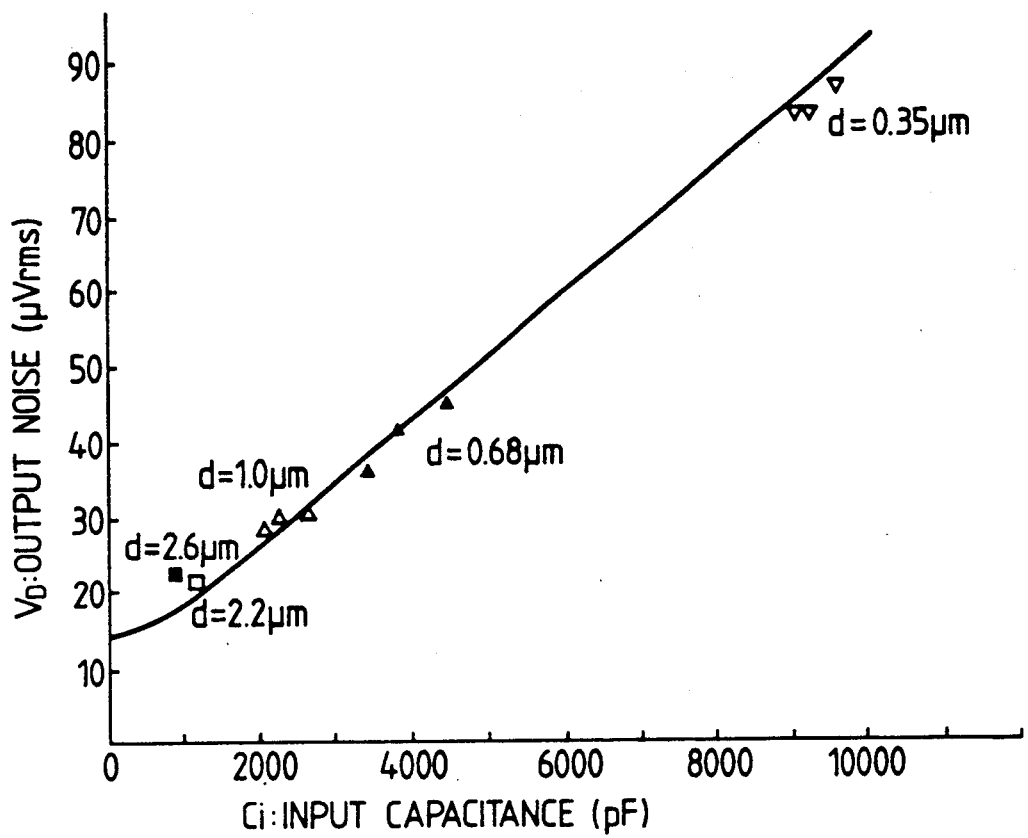

On the other hand, the voltage noise chiefly comes in a resistant heat noise and an operational amplifier noise. The operational amplifier noise increases according to an increase of the input capacitance $C_i$. In the case of detector for use on the X-ray CT scanner using an amorphous silicon diode according to the invention, while a large area as 20 to 30 mm$^2$ is required for the diode, the depletion layer thickness is extremely small. Accordingly, the capacitance C of the photodiode is maximized, and the input capacitance $C_i$ of the operational amplifier becomes large, therefore the detector noise voltage $V_D$ depends chiefly on $C_i$. FIG. 13 shows a result obtained through having confirmed the above experimentally. That is, with $R_f$ at fMΩ and $C_f$ at 40 pF in the detection circuit of FIG. 11, a plurality of X-ray detection systems different only in input capacitance $C_i$ are prepared by changing chiefly the thickness of photodiodes, and values of the detector noise voltage $V_D$ are obtained through measuring the output voltage $V_S$ without incidence of the X-ray. From FIG. 13, it is found that $V_D \ C_i$ at $C_i = 1,500$ pF or over for $C_i$ dependency of $V_D$.

Figure 12:
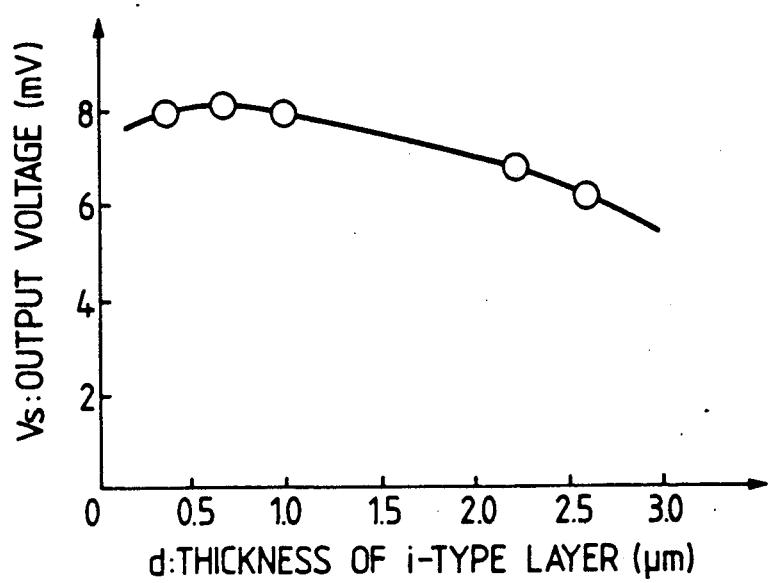
FIG. 12, FIG. 13, FIG. 14 and FIG. 15 are characteristic drawings showing various characteristics to a thickness or capacitance of the photodiode of the embodiment.
Figure 14:
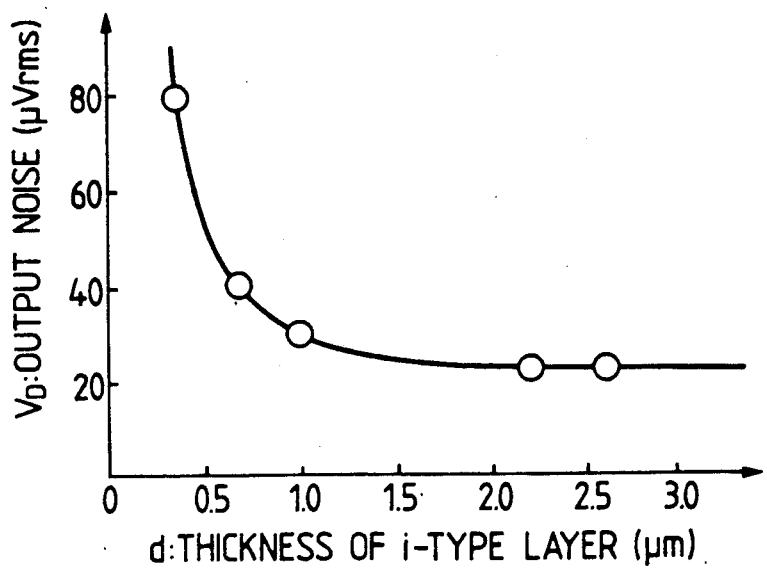
Figure 15:
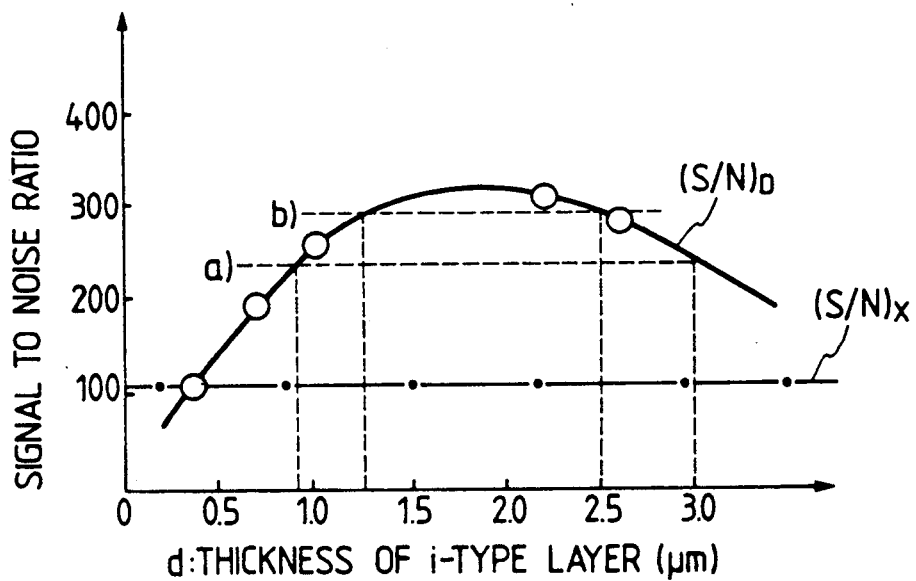

Further, with the diode area constant at 25 mm$^2$, a result given in FIG. 14 was obtained from ensuring a relation between the i-layer thickness d of the photodiode and the noise voltage $V_D$. From comparing FIG. 14 with FIG. 12, it can be said that while the optimum i-layer thickness d is about 0.5 μm from the viewpoint of expecting the maximum output voltage, the value d is not necessarily to ensure the detector with high S/N ratio as the detector noise voltage $V_D$ is large. A graphed result obtained through getting an S/N ratio $(S/N)_D$ caused by $V_D$ from data of FIG. 12 and FIG. 14 is shown in FIG. 15. One-dot chain line of FIG. 15 indicates the level of S/N ratio $(S/N)_X$ caused by the X-ray quantum noise voltage $V_X$ calculated according to Eq. (6) hereinbefore.

The matter on how many times of the X-ray quantum noise voltage $V_X$ is the final detection signal noise $V_N$ permitted as the X-ray CT system varies according to a pickup portion and object of diagnosis, however, it is normally conceivable that $V_N$ may be permitted as high as 1.1 times of $V_X$. Now, therefore, if $V_N 1.1 V_X$ is a specification required for the system, a required specification for $V_D$ is $V_D \leq 0.46 V_X$ from Eq. (1).

Thus, the following equation is obtained.

$$(S/N)_D \geq (S/N)_X/0.46 = 2.2(S/N)_X \qquad (14)$$

If the condition of Eq. (14) is applied to FIG. 15, the above range is so indicated by a broken line (a) of FIG. 15, and the i-layer thickness d will be:

$$0.9 \ \mu m \leq d \leq 3.0 \ \mu m \qquad (15)$$

That is, in the range of the i-layer thickness, an S/N ratio of the signal obtained finally is caused chiefly by a quantum noise of the incident X-ray, thus realizing a high S/N ratio. Further, in the range indicated by the broken line in FIG. 15, or $$1.25 \, \mu m \leq d \leq 2.5 \, \mu m \tag{16}$$

$(S/N)_D$ is 300 or over. Accordingly, a noise of the detection system is so small as to be neglected as compared with the X-ray quantum noise, and a radiation detection is realizable at high S/N ratio.

Then, Eqs. (15) and (16) represent results obtained through data of the photodiode 25 mm² in area. On the other hand, the input capacitance $C_i$ which is a main cause of the noise voltage $V_D$ depends not only on d but also on area of the photodiode. That is, the following equation may hold:

$$C_i \sim C = \epsilon \epsilon_0 S/d \tag{17}$$

where $\epsilon$ denotes a dielectric constant of amorphous silicon, $\epsilon_0$ denotes a vacuum dielectric constant, and S denotes an area of a-Si photodiode.

Now, the following equation will be obtained from rewriting range of Eqs. (15) and (16) into more general ranges by means of Eq. (17):

$$2.6 \times 10^{-3} \epsilon S \leq d \leq 8.7 \times 10^{-3} \epsilon S \tag{15}$$

$$3.6 \times 10^{-3} \epsilon S \leq d \leq 7.1 \times 10^{-3} \epsilon S \tag{16}$$

As described above, an X-ray detector with high S/N ratio is obtainable from making the i-layer thickness of the amorphous silicon photodiode larger than the normal thickness set from the viewpoint of sensitivity.

What is claimed is:

1. A radiation detector block to be arrayed for forming a detector array in an X-ray CT, said radiation detector block comprising:
    a plurality of detector elements each comprising a scintillator and a thin film photodiode, said scintillator having a front plane to which X-rays to be detected are incident and a back plane opposite to said front plane, each thin-film photodiode being formed by a first electrode layer, at least one amorphous silicon layer and a second electrode layer successively deposited over said scintillator at the back plane;
    a plate-like supporting member having a first surface to which each of said detector elements is bonded so that said detector elements are arrayed in an array with spaces between said detector elements in such a way that a main part of the photodiode of each of said detector elements is covered with said supporting member and one end part of each of said photodiodes is exposed;
    a plurality of separators inserted in said spaces for screening said detector elements radially and optically from each other;
    a plurality of signal lines rigidly formed on a second surface of said supporting member opposite to said first surface; and
    a plurality of bonding wires each electrically connecting each of said signal lines to a photodiode of each of said detector elements at said one end part of said photodiode.

2. The radiation detector as defined in claim 1, wherein said supporting member and a plurality of scintillators are bonded by an insulation adhesive.

3. The radiation detector as defined in claim 1, wherein the surface of each of said photodiodes which is bonded at least to the supporting member is coated by an insulating protection layer.

4. The radiation detector as defined in claim 1, wherein a bonding pad formed by a thick film printing is formed over the surfaces of said scintillators over which said photodiodes are formed, the bonding pad and signal lines on said supporting member are connected by wire bonding.

5. The radiation detector as defined in claim 1, wherein another supporting member is fixed on the supporting member provided with said signal lines.

6. The radiation detector as defined in claim 5, wherein said another supporting member is bonded both to a back of the supporting member provided with said signal lines and to an end portion of surfaces of said plurality of scintillators on which said photodiodes are formed.

7. The radiation detector as defined in claim 1, wherein said photodiodes are formed each into a rectangle a little wider in width near its opposite ends.

8. A process for manufacturing a radiation detector block of an X-ray CT scanner wherein a plurality of radiation detector elements are arrayed to form the detector block, said process comprising:
    a first step for forming a plurality of amorphous silicon-containing photodiodes on the back of a scintillator block having a width covering a plurality of radiation detector elements divided into element domains;
    a second step for bonding and fixing a plate-like supporting member on which a plurality of signal lines are fitted on the back of said scintillator block so as to cover at least a part of said plurality of photodiodes;
    a third step for connecting said plurality of photodiodes and said plurality of signal lines together through wire bonding;
    a fourth step for cutting said scintillator block by forming a plurality of grooves along split lines between adjacent radiation detector elements from the front of said detector block; and
    a fifth step for inserting separators for screening the radiation detector elements radially or optically from each other in said plurality of grooves.

9. The process for manufacturing a radiation detector as defined in claim 8, further comprising a step for coating a wire-bonded portion with resin between said third step and fourth step.

10. The process for manufacturing a radiation detector as defined in claim 8, wherein the grooves in said fourth step reach a layer of the adhesive used for bonding in said second step.

11. The process for manufacturing a radiation detector as defined in claim 8, wherein the grooves in said fourth step reach a surface of said supporting member.

12. The process for manufacturing a radiation detector as defined in claim 8, comprising a step for bonding another supporting member further to a back of said supporting member at least after said third step.

* * * * *